United States Patent
Van Dalen et al.

(10) Patent No.: US 6,605,862 B2
(45) Date of Patent: Aug. 12, 2003

(54) TRENCH SEMICONDUCTOR DEVICES

(75) Inventors: Rob Van Dalen, Eindhoven (NL);
Christelle Rochefort, Haasrode (BE);
Godefridus A. M. Hurkx, Best (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/068,921

(22) Filed: Feb. 7, 2002

(65) Prior Publication Data

US 2002/0130358 A1 Sep. 19, 2002

(30) Foreign Application Priority Data

Feb. 22, 2001 (GB) .............................. 0104342

(51) Int. Cl.$^7$ .................... H01L 29/414; H01L 29/43
(52) U.S. Cl. ...................................... 257/621; 257/622
(58) Field of Search .......................... 257/621; 1/622

(56) References Cited

U.S. PATENT DOCUMENTS

| | | | |
|---|---|---|---|
| 4,754,310 A | 6/1988 | Coe | 257/287 |
| 4,933,739 A * | 6/1990 | Harari | 257/621 |
| 5,895,951 A * | 4/1999 | So et al. | 257/330 |
| 6,184,565 B1 * | 2/2001 | Beasom | 257/487 |

FOREIGN PATENT DOCUMENTS

| | | | | |
|---|---|---|---|---|
| WO | 19848828 | 5/2000 | ............ | H01L/29/06 |
| WO | WO0159844 | 8/2001 | ............ | H01L/29/06 |
| WO | WO0159846 | 8/2001 | ............ | H01L/29/78 |

* cited by examiner

Primary Examiner—Allan R. Wilson
(74) Attorney, Agent, or Firm—Steven R. Biren

(57) ABSTRACT

A semiconductor device, such as a MOSFET or PN diode rectifier, has a p-n junction (24) between a first device region (23) and an underlying voltage-sustaining zone (20). Trenched field-shaping regions (40) extend through the voltage-sustaining zone (20) to improve the voltage-blocking and on-resistance characteristics of the device. The trenched field-shaping region (40) comprises a resistive path (42) accommodated in a trench (41) that has an insulating layer (44) at its side-walls. The insulating layer (44) dielectrically couples potential from the resistive path (42) to the voltage-sustaining zone (20) that is depleted in a voltage-blocking mode of operation of the device. The insulating layer (44) extends at the side-walls of the trench (41) to an upper level (81) that is higher than a lower level (82) at which the resistive path (42) starts in the trench (41). This lower level (82) is more closely aligned to the p-n junction (24) and is protected by the insulating layer (44) extending to the higher level (81). This construction enables the electric field distribution in the voltage-sustaining zone (20) to be improved by aligning very closely the start of the potential drop along the resistive path (42) with the p-n junction depth (d).

11 Claims, 4 Drawing Sheets

US 6,605,862 B2

TRENCH SEMICONDUCTOR DEVICES

BACKGROUND OF THE INVENTION

This invention relates to semiconductor devices having a p-n junction between a first device region of one conductivity type and an underlying voltage-sustaining zone, and having trenched field-shaping regions that extend through the voltage-sustaining zone. Such devices may be, for example, a PN diode rectifier or an insulated-gate field-effect device (often termed MOSFET).

Many known types of semiconductor device comprise a semiconductor body in which a p-n junction is formed between a first device region of one conductivity type and an underlying voltage-sustaining zone. Field-effect transistors, for example power MOSFETs, are one specific type having the voltage-sustaining zone as a drain drift region of the transistor. Power rectifier PiN diodes are another specific type, in which the voltage-sustaining zone is a lower-doped intermediate region between anode (P) and cathode (N) regions.

Published German patent application DE-A-198 48 828 and the PCT published patent applications WO 01/59844, WO 01/59847 and WO 01/59846, (our refs. PHNL000065; PHNL000066; PHNL000067) disclose the incorporation into such devices of trenched field-shaping regions that extend in trenches through the voltage-sustaining zone to an underlying second device region; the trenches extend from an upper surface of the body through the first device region and the voltage-sustaining zone. The trench accommodates a resistive path of semi-insulating material that is connected between the second device region and a device electrode that contacts the first device region. The voltage-sustaining zone is so dimensioned and doped between the trenched field-shaping regions as to be depleted of free charge carriers between the trenched field-shaping regions in a voltage-blocking mode of operation, by the spread of a depletion layer from the p-n junction.

In some embodiments, an insulating layer is present at side-walls of the trench to dielectrically couple potential from the resistive path to the voltage-sustaining region. In all the depicted embodiments (except for FIGS. 4 and 5 of DE-A-198 48 828) the semi-insulating material extends through the whole depth of the trench, and so also does the insulating layer when present at the side-walls. As a consequence, in all the embodiments that have an insulating layer at side-walls of the trench, the p-n junction is depicted as extending laterally to the insulating layer.

FIGS. 4 and 5 of DE-A-198 48 828 depict MOSFETs, in which it is generally desired to short-circuit the transistor body region (channel region) to the source electrode that contacts the source region. This is achieved in the upper part of the trench in the MOSFETs of FIGS. 4 and 5 of DE-A-198 48 828. Thus, the semi-insulating material 7 (FIGS. 4 and 5) and the insulating layer 13 (present in FIG. 4) are removed from the upper part of the trench so as to expose the transistor body region (channel region 12). This removal permits the source electrode 10 to extend into the upper part of the trench to contact both the source region 11 and the transistor body region 12. A consequence of this form of short-circuit is that the resistive path now starts below the level of the upper surface of the body. Another consequence of this form of short-circuit is that when an insulating layer (13 in FIG. 4) is present, this insulating layer is removed to at least the same level as the semi-insulating material 7. This is illustrated in FIG. 4 of DE-A-198 48 828.

The incorporation of trenched field-shaping regions enables desired voltage-sustaining, voltage-blocking, breakdown voltage characteristics of the devices to be obtained using for the voltage-sustaining zone a semiconductor region (or interposed semiconductor regions) that has (or have) a higher dopant concentration, and thus lower resistivity, than would conventionally be required by a conventional square law relationship between breakdown voltage and series resistivity. These devices are a modification of those disclosed in U.S. Pat. No. 4,754,310 (our reference PHB32740). The whole contents of U.S. Pat. No. 4,754,310, DE-A-198 48 828, WO 01/59844, WO 01/59846 and WO 01/59847 are hereby incorporated herein as reference material.

SUMMARY OF THE INVENTION

It is an aim of the present invention to modify the design parameters for trenched field-shaping regions in such a way as to improve the electric field distribution in the adjacent voltage-sustaining zone.

According to one aspect of the present invention, there is provided a semiconductor device having a p-n junction between a first device region of one conductivity type and an underlying voltage-sustaining zone, wherein the first device extends laterally to an insulating layer at side-walls of a trench that accommodates a resistive path of a trenched field-shaping region extending through the voltage-sustaining zone, the insulating layer dielectrically couples potential from the resistive path to the voltage-sustaining zone that is depleted in a voltage-blocking mode of operation of the device, the insulating layer extends at the side-walls of the trench to an upper level that is higher than a lower level at which the resistive path starts in the trench, which lower level is more closely aligned to the depth of the p-n junction in the body and is protected by the insulating layer.

Such a construction (with its respective upper and lower levels for the insulating layer and the resistive path) enables the electric field distribution in the voltage-sustaining zone to be improved by more closely aligning the start of the potential drop along the resistive path (within the trench) with the p-n junction depth (outside the trench). As such, a more optimum electric field distribution can be achieved in the depleted voltage-sustaining zone in the voltage-blocking mode of operation of the device, so better optimising its breakdown voltage.

In the MOSFETs of FIGS. 4 and 5 of DE-A-198 48 828, the level at which the resistive path starts is determined by the depth of the p-n junction between the source region and the transistor body region. By contrast therewith, the level (lower level) at which the resistive path starts in a MOSFET in accordance with the present invention is determined by the depth of the p-n junction between the transistor body region and the drain drift region (voltage-sustaining zone). Because the insulating layer extends to a higher level, the lower level (at which the resistive path starts) can be aligned very closely to the p-n junction with the voltage-sustaining zone. This close alignment is possible without risking a high leakage current, the magnitude of which might otherwise vary depending upon the alignment tolerances in any given manufacturing process. Indeed, the lower level at which the resistive path starts may even be slightly below the level at which the p-n junction may meet the insulating layer. Thus, a termination of the p-n junction at the side wall of the trench can remain protected by the insulating layer extending to the higher level.

BRIEF DESCRIPTION OF THE DRAWINGS

Advantageous features in accordance with the present invention are set out in the appended Claims. These and others will be illustrated in specific embodiments of the invention, by way of example, now to be described with reference to the accompanying drawings, in which:

Figure 1:
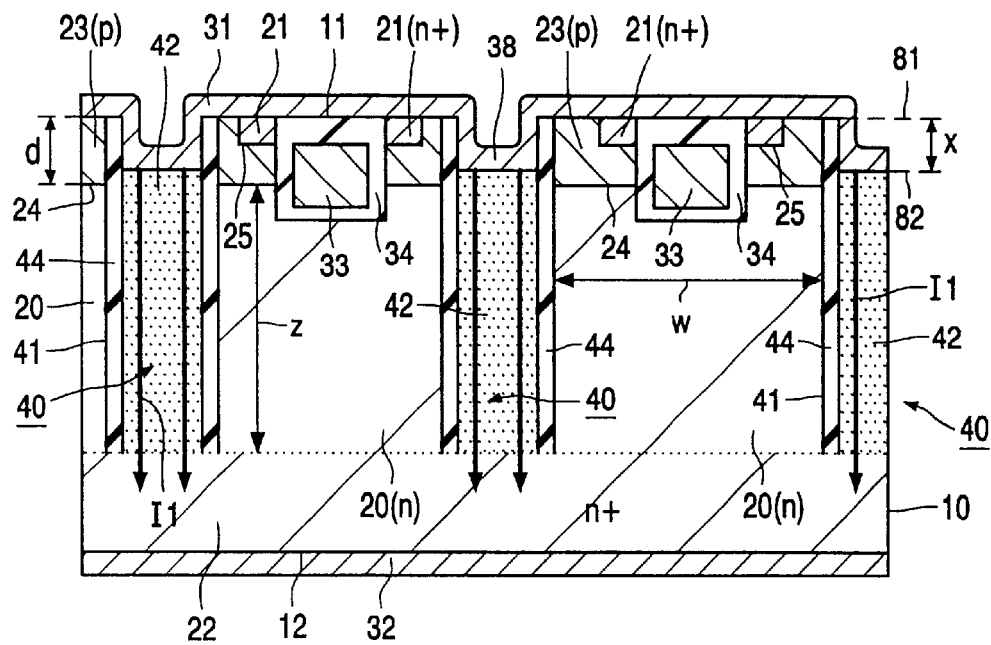
FIGS. 1 to 3 are diagrammatic cross-sectional views of part of three separate MOSFET examples of semiconductor devices in accordance with the invention, showing three separate examples of suitably constructed trenched field-shaping regions.

It should be noted that the FIGS. 1 to 4 and FIGS. 7 and 8 are diagrammatic. Relative dimensions and proportions of parts of these Figures have been shown exaggerated or reduced in size for the sake of clarity and convenience in the drawings. The same reference signs are generally used to refer to corresponding or similar features in the different embodiments.

DESCRIPTION OF THE PREFERRED EMBODIMENTS

FIG. 1 shows one embodiment of a semiconductor device comprising a monocrystalline semiconductor body 10 that includes a voltage-sustaining zone 20 between first and second device regions 23 and 22. The region 23 forms a p-n junction 24 with the voltage-sustaining zone 20. These regions 23 and 22 have electrode connections adjacent to respective first and second opposite surfaces 11 and 12 of the body 10.

In this example, the device is a FET having source and drain regions 21 and 22 respectively, that are contacted by source and drain electrodes 31 and 32 respectively. The source region 21 is separated, in the usual manner, from the voltage-sustaining zone 20 by a channel-accommodating body region (also sometimes termed "base region") of the transistor that is the region 23. The region 23 forms a p-n junction 25 with the source region 21 and the p-n junction 24 with the voltage-sustaining zone 20. The zone 20 is a drain drift region of the transistor.

The transistor is of the MOSFET type having a gate electrode 33 that is insulated from the region 23 by an intermediate gate dielectric layer 34, across which the gate electrode 33 is capacitively coupled. Thus, the gate electrode 33 serves in known manner for inducing and controlling a conduction channel in the region 23, between the source and drain regions 21 and 22 in an on-state of the transistor.

The device of FIG. 1 is also of an advanced type having trenched field-shaping regions 40, which are modifications of the such regions as disclosed in DE-A-198 48 828, WO 01/59844, WO 01/59846 and WO 01/59847. The trenched field-shaping regions 40 enhance the breakdown voltage of the device.

Thus, there are trenches 41 that extend into the body 10 from the surface 11. The layout of these trenches 41 may be in the form of an array and/or an interconnected network and/or an individual plurality of separate trenches. These trenches 41 (or trench network 41) divide the region 23 and zone 20 into mesas of width w in the cross-section of FIG. 1. Each field-shaping region 40 includes in the trench 41 a resistive path 42 that extends thereby through the voltage-sustaining zone 20 to the electrode-connected region 22. The path 42 is connected between the electrodes 31 and 32. There is an insulating layer 44 at the side-walls of the trench 41 to dielectrically couple potential from the resistive path 42 to the voltage-sustaining zone 20.

In a voltage-blocking state of the FIG. 1 MOSFET, a depletion layer spreads in the voltage-sustaining zone 20 from the reverse-biased p-n junction 24 and from the side-walls of the trenches 41. The dimensions w and z and doping Nd of the voltage-sustaining zone 20 are appropriately chosen in known manner such that the zone 20 between the trenched field-shaping regions 40 is depleted of free charge carriers in this voltage-blocking state.

Briefly stated, the breakdown enhancement results as follows. A small leakage current I1 passes through the resistive paths 42 between the electrodes 31 and 32, and so these paths 42 act as resistors that generate a linear potential gradient and hence a uniform electric field distribution. This potential gradient is capacitively coupled across the insulating layer 44 to the voltage-sustaining zone 20. By making the dimensions w of the zone 20 sufficiently small, this uniform electric field can be passed to the intermediate areas of the zone 20 (the drift region of the MOSFET). This leads to a reduction in peak electric field in the voltage-sustaining zone 20 and a corresponding increase in breakdown voltage for a given doping level Nd of zone 20. For a given breakdown voltage, the doping level Nd can be increased, so reducing the on-resistance of the device.

Computer simulations as well as experimental findings show that the optimum achievable breakdown voltage depends on the position (level 82) of the top of the resistive path 42 with respect to the depth d of the p-n junction 24. Too large an offset between the p-n junction 24 and the top level 82 of the resistive path 42 results in a large lateral electric field around this p-n junction 24 where it extends to the insulating layer 44. This follows directly from the nature of the electric field distribution in the resistive path 42. Thus, the voltage drop in the resistive path 42 starts directly from the top contact level 82 of the path 42, whereas the region 23 (on the other side of the insulating layer 44) remains at a constant voltage up to a depth close to the p-n junction 24.

Thus, in the FIG. 1 device in accordance with the present invention, the resistive path 42 starts in the trench 41 at a level 82 closely aligned to where the p-n junction 24 meets the insulating layer 44. The insulating layer 44 extends at the side-walls of the trench 41 to an upper level 81 that is higher than the level 82 at which the resistive path 42 starts. Thus, the termination of the p-n junction 24 at the trench 41 is protected and passivated by the insulating layer 44, thereby reducing the leakage current at the side-wall of the trench 41. Whereas inside the trench 41, the lower level 82 at which the path 42 starts is more closely aligned (than the insulating-layer level 81) to where the p-n junction 24 meets the side-wall of the trench 41.

Figure 6:
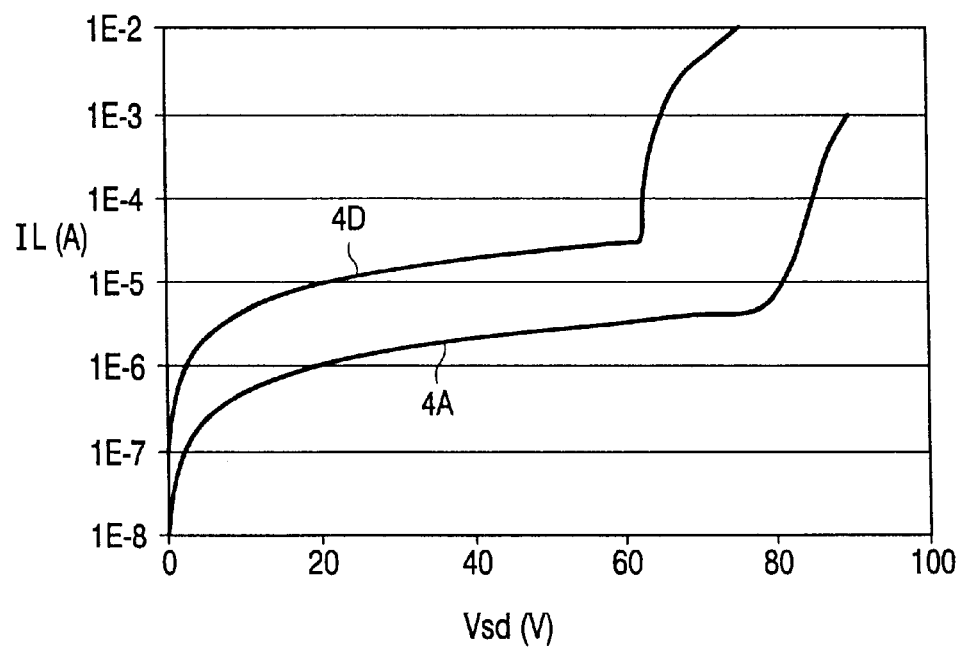
FIG. 6 is a graph of experimental measurements of the device leakage current IL in Amps with bias voltage Vsd in volts between the device electrodes, for the different constructions of FIGS. 4A and 4D, illustrating the effect of including an insulating layer at the side-wall of the trench where the p-n junction terminates.
Figure 4A:
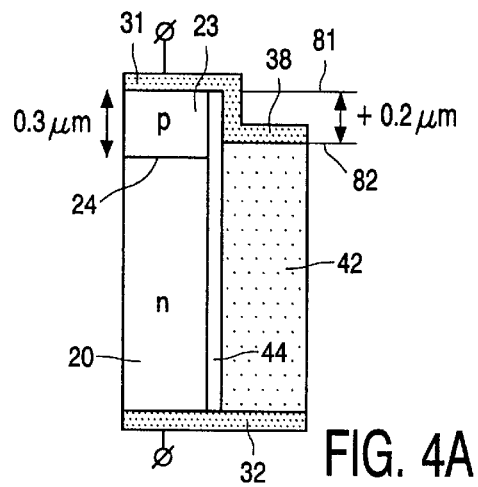
FIG. 4A is a simplified representation of the parts of the device of FIG. 1, adjacent to the insulated side-wall of a trenched field-shaping region, showing a specific example of suitably constructed levels in accordance with the present invention.
Figure 4B:
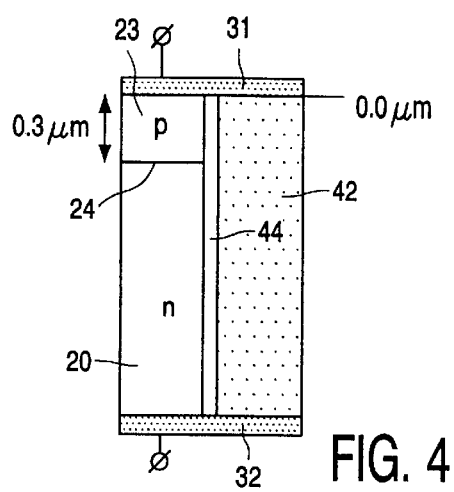
FIGS. 4B to 4D are simplified representations of corresponding parts to those of FIG. 4A, but with less suitable constructions which are not in accordance with the present invention.
Figure 4C:
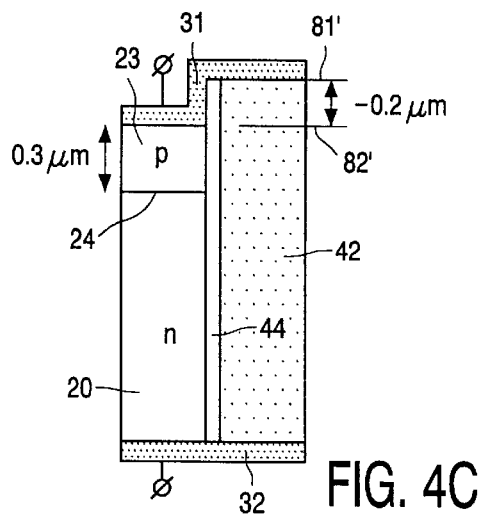
Figure 4D:
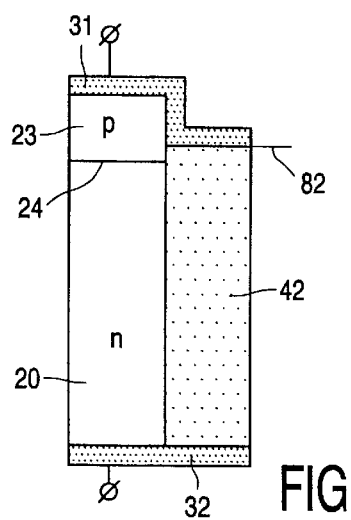
Figure 5:
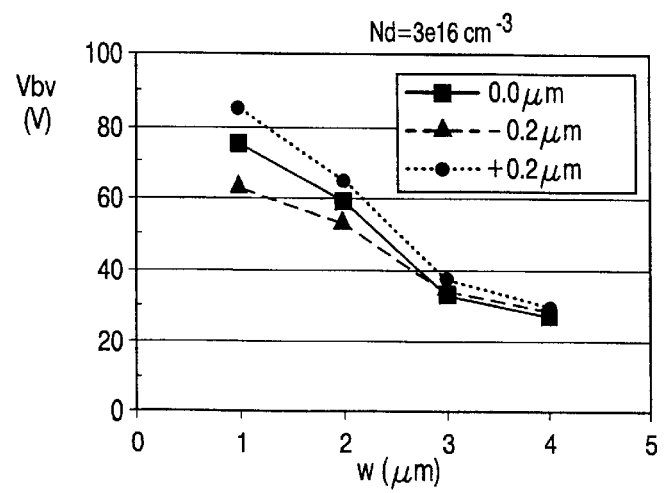
FIG. 5 is a graph of computer simulations of the breakdown voltage Vbv in Volts with mesa width w in μm (micrometers) for the different constructions of FIGS. 4A to 4C, illustrating the effect of their different levels.

The effect of this advantageous construction with its different levels 81 and 82 in the FIG. 1 device is shown in the computer simulations of FIG. 5, which model the simplified representations of FIGS. 4A to 4C, and in the experimental results of FIG. 6. For these simulations and experiments the following parameters applied:

- a doping concentration Nd for the n-type zone 20 of $3 \times 10^{16}$ cm$^{-3}$
- a much higher doping concentration for the region 23, so that its potential corresponds to that applied to electrode 31,
- similarly, the region 22 is assumed to have such a high doping concentration that its potential corresponds to that applied to electrode 32 (and the region 22 need not be represented in FIGS. 4A to 4D),
- a junction depth d of 0.3 μm (micrometers) from the surface 11,
- a thickness z of 3.7 μm of the zone 20 from the p-n junction 24, i.e. a trench depth of 4 μm from the surface 11 through the region 23 and the zone 20,
- coincidence of the insulating-layer level 81 with the surface 11,
- an offset x (of the path-start level 82 from the level 81) that is +0.2 μm for FIG. 4A, −0.2 μm for FIG. 4C, and non-existent (0.0 μm) for FIG. 4B,
- an insulating layer 44 of silicon dioxide 25 nm (nanometers) thick which is present in FIGS. 4A to 4C but is absent in FIG. 4D.

As can be seen from FIG. 5, the breakdown voltage Vbv of the device increases as the mesa width w is reduced from 4 μm to 1 μm. This increase in Vbv reflects an improved transfer of the uniform field in the path 42 to the whole width w of the deleted zone 20.

However, FIG. 5 also shows how the breakdown voltage Vbv increases as the path-start level 82 is aligned closer to the p-n junction 24. This increase in Vbv reflects a closer correspondence between the linear potential gradient along the path 42 and the uniform electric field over the distance z of the zone 20 (from the p-n junction 24 to the underlying device region 22).

Because the termination of the p-n junction 24 at the trench side-wall is protected by the insulating layer 44 (extending to the higher level 81), manufacturing processes can be adopted in which the path-start level 82 is designed to be aligned closely around the level of the p-n junction 24. Thus, the alignment tolerances of the adopted process may result in the path-start level 82 being in the range of, for example, 0.1 μm above the p-n junction 24 as illustrated in FIG. 4A to 0.1 μm below the p-n junction 24. This latter possibility of the level 82 being slightly below the termination of the p-n junction 24 at the trench 41 is achievable in accordance with the invention because of the higher level 81 for the insulating layer 44.

FIG. 6 shows the variation in device leakage current IL (between the electrodes 31 and 32) with bias voltage Vsd (between the electrodes 31 and 32) for two devices 4A & 4D. These two devices are identical, except that device 4A includes the side-wall insulating layer 44 (25 nm oxide) and device 4D does not. Such devices are represented in the comparison of FIGS. 4A and 4D. The resistive paths 42 were of POLYDOX material. As shown, the leakage current increases by a factor 10 when the insulating layer 44 is omitted from the side-wall of the trench 41. The applicants believe that most of the excess leakage current flow in the device 4D occurs into the zone 20, across the un-insulated side-wall in the vicinity of the p-n junction 24. As such, it is particularly important to include the insulating layer 44 in this vicinity, i.e. the area at and below where the p-n junction 24 extends to the side-wall.

FIG. 6 also shows a reduction in breakdown voltage due to the omission of the side-wall insulating layer 44. The applicants believe that most of this breakdown-voltage reduction is attributable to the degradation in the linear potential gradient along the path 42, due to escape of leakage current from the path 42 to the zone 20 in the absence of the intermediate insulating layer 44.

In both the devices 4A and 4D, the path-start level 82 was above the p-n junction level. FIG. 6 does not show how the leakage current and breakdown voltage may be affected by having the path-start level 82 below the p-n junction level. The FIG. 4D arrangement without an insulating layer 44 becomes unusable if the path-start level 82 is below the p-n junction level, because the p-n junction 24 is then short-circuited by the path contact (31). However, such a change in level for the FIG. 4A arrangement presents no problem due to the protecting insulating layer 44.

Various manufacturing technologies may be used for providing the path-start level 82 to be in close alignment around the level of the p-n junction 24 and to be below the upper level 81 of the insulating layer 44 at the side-wall of the trench 41. Except for these special level features, the various device parts may be of known materials, doping concentrations, dimensions and construction. Typically, the device body 10 is of silicon. Polycrystalline silicon doped with oxygen and/or nitrogen (for example, so-called POLYDOX or SIPOS) may provide the semi-insulating material of the resistive paths 42.

The thin insulating layer 44 may be of thermally-grown silicon dioxide, or it may be a deposited layer of, for example, silicon dioxide and/or silicon nitride. Typically, the thickness of the layer 44 may be in the range of, for example, about 25 nm to 50 nm. Thus, in a specific example, the layer 44 may be provided by: (i) oxidising the exposed silicon side-walls and bottom of the trench 41 so as to form an oxide that is 38 nm thick, and (ii) then etching away this oxide from the bottom of the trench 41 so as to re-expose the region 22 at the bottom of the trench. In this case, the etching step (ii) may remove about a third of the 38 nm thick oxide on the side-walls of the trench 41, i.e. so thinning is the layer 44 to about 25 nm. Such an oxide layer 44 has good dielectric integrity and good protective properties for the p-n junction 24.

In a typical example in a silicon body 10, the zone 20 may have a uniform doping concentration in the range of $5.10^{15}$ to $5.10^{16}$ arsenic or phosphorus atoms.cm$^{-3}$, and the pitch (centre-to-centre spacing) of the trenched regions 40 may be in the range of 2 μm to 10 μm. The thickness z of zone 20 is related to the desired breakdown voltage of the device. For breakdown voltages of between 60V and 1 kV, the thickness z is typically in the range of 3 μm (micrometers) to 50 μm.

FIGS. 1 and 4A illustrate one such manufacturing technology that involves etching the semi-insulating material from the upper part of the trench 41. Thus, in this device, the semi-insulating material 42 is absent above the level 82 in the trench 41. The device electrode 31 comprises a conductive portion 38 that extends into the upper part of the trench 41 to contact the resistive path 42 at this level 82. This conductive portion 38 may be a metal layer (for example, of aluminium or tungsten) that also provides the electrode 31 on the body surface 11, or it may be a filler material (such as conductively-doped polycrystalline silicon, or tungsten) that in-fills the upper part of the trench 41. In this embodiment of FIGS. 1 and 4A, the higher level 81 to which the insulating layer 44 extends coincides substantially with the upper surface 11 of the body 10. Thus. in this embodiment, the device electrode 31 contacts the device region 23 at the body surface 11.

Figure 2:
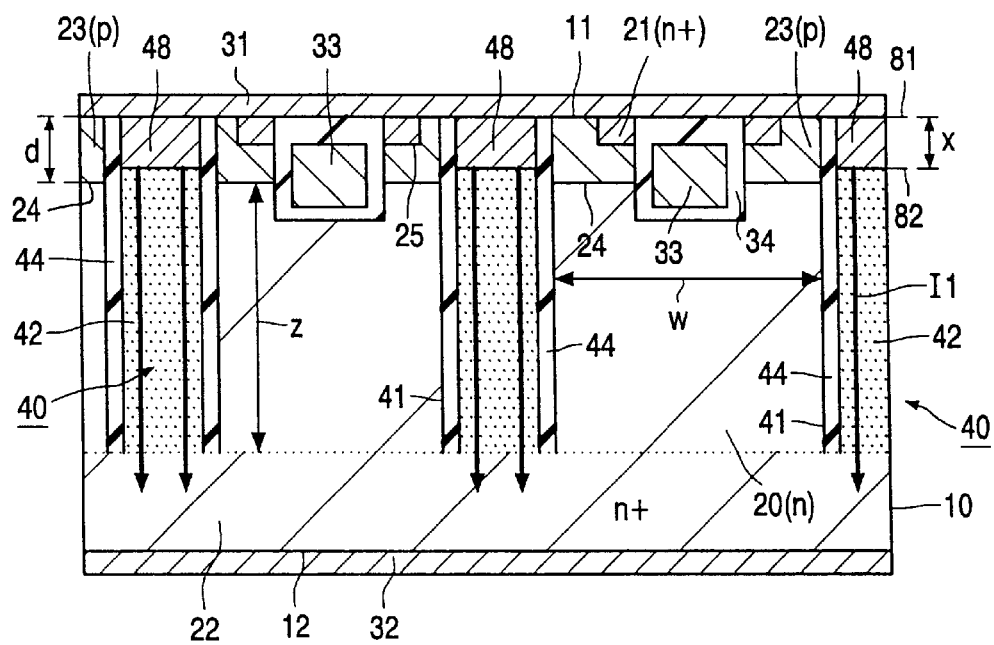

FIG. 2 illustrates a different manufacturing technology, in which the semi-insulating material is retained to the same upper level 81 in the trench as the insulating layer 44. However, this semi-insulating material is highly doped with conductive dopant, for example boron or phosphorus, between the upper level 81 and lower level 82, so as to form a terminal region 48 of the resistive path 42. The doping of the region 48 may be effected by implanting and/or diffusing a high dose of the dopant in the semi-insulating material, for example an implant dose in excess of $3 \times 10^{15}$ cm$^{-2}$ in POLYDOX or SIPOS. The device electrode 31 that contacts the device region 23 also contacts this terminal region 48 of the resistive path 42.

Although FIGS. 1 and 2 illustrate the level 82 being slightly above the depth d of the p-n junction 24, the level 82 in FIGS. 1 and 2 may coincide with or be slightly below the level at which the p-n junction 24 meets the insulating layer 44. Such a modification is illustrated in FIG. 3 where the level 82 is a very short distance x3 below the depth d.

Figure 3:
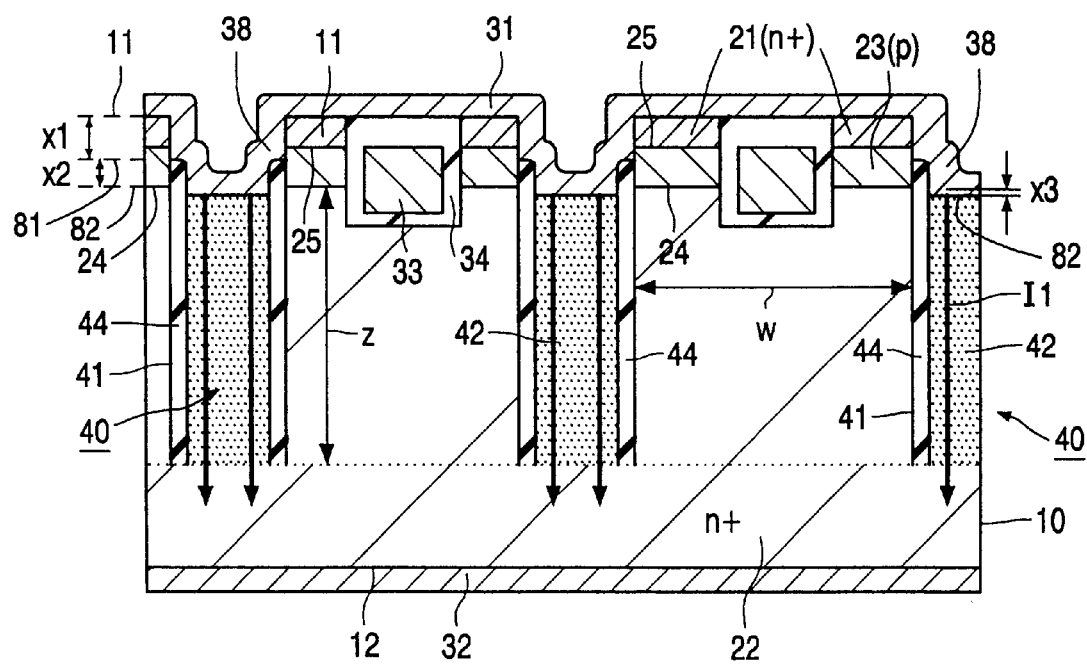

The devices of FIGS. 1 to 3 are field-effect transistors, in which the first device region 23 is a transistor body region, and the device electrode 31 is a source electrode that also contacts a source region 21 of opposite conductivity type. FIGS. 1 and 2 show the source electrode 31 contacting the body region 23 at the upper surface 11 of the body 10. However, the source electrode 31 may contact the body region 23 in the upper part of the trench 41. Such an arrangement is illustrated in FIG. 3. In this embodiment, the upper level 81 to which the insulating layer 44 extends is below the upper surface 11 of the body 10 by a distance x1 that is larger than the depth of the source region 21. The source electrode 31 extends into the upper part of the trench 41 to contact both the transistor body region 23 and the source region 21 at the side-wall of the trench 41 and to contact the resistive path 42 at the level 82 in the trench 41. This level 82 is a distance x2 below the level 81.

This FIG. 3 construction is particularly beneficial for a trench-gate MOSFET, in which the trench-gate structure 33,34 is located in between trenches 41 of the trenched field-shaping regions 40. In this case, as illustrated in FIG. 3, the source region 21 can extend laterally from an insulated side-wall of the trench-gate structure 33,34 to the side-wall of the neighbouring trench 41 of the trenched field-shaping regions 40. This permits the achievement of a more compact MOSFET structure, with smaller pitch for the trenched field-shaping regions 40.

The trenched field-shaping regions 40 illustrated so far in FIGS. 1 to 3 have their insulated trenches 41 filled with the semi-insulating material that provides the vertical resistive paths 42. In that case, the width of the trench 41 provides the cross-section that determines the resistance of the path 42. Extra degrees of freedom in determining this resistance value and in determining the different levels 81 and 82 can be achieved using an additional insulating in-fill 46, for example as illustrated in FIGS. 7 and 8.

Figure 7:
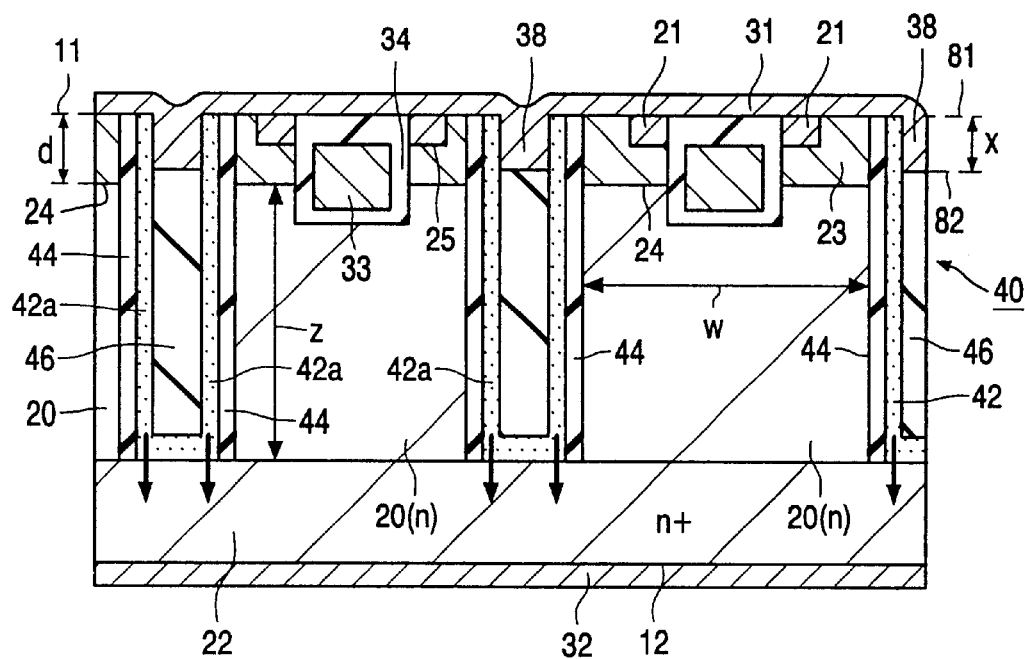
FIGS. 7 and 8 are diagrammatic cross-sectional views of modifications, also in accordance with the invention, of the MOSFET examples of FIGS. 1 and 2 to include insulating in-fills in the trenched field-shaping regions.
Figure 8:
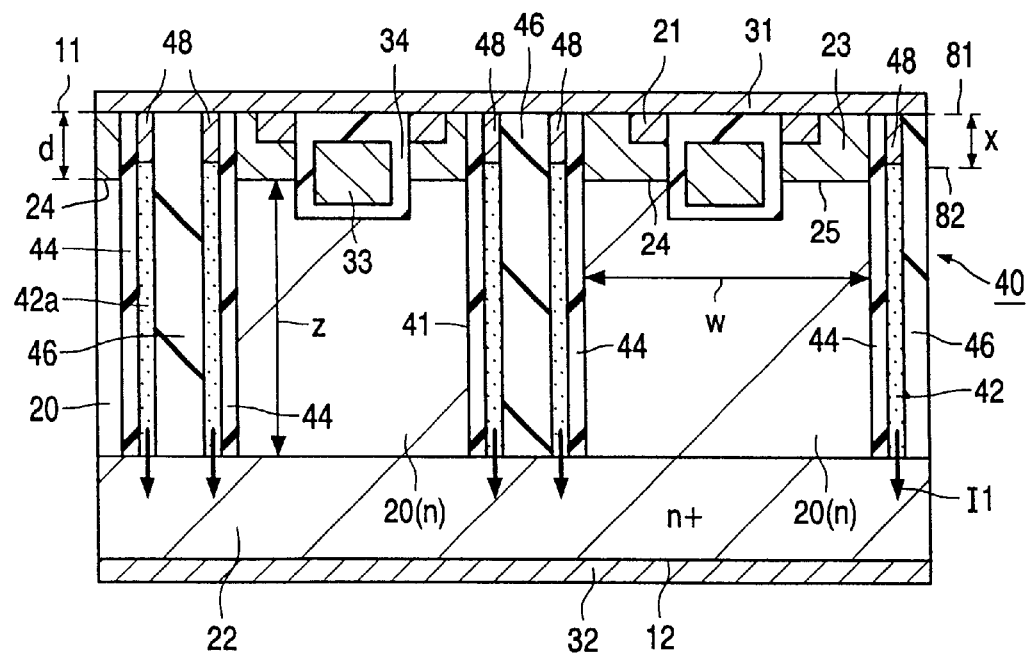

In FIGS. 7 and 8, the resistive path 42 of the trenched field-shaping regions 40 comprises a resistive layer 42a of semi-insulating material that extends along the insulated side-walls of the trenches 41. As shown in FIG. 7, the resistive layer 42a may also extend across the bottom of each/the trench 41. Alternatively, it may be removed from the trench bottom, as shown in FIG. 8. An insulating filler material 46 is present on the layer 42a to fill the remainder of the trench 41 to a desired level. In this case, the thickness of the layer 42a provides the cross-section that determines the resistance of the path 42. Typically, the layer 42a comprises a semi-insulating material, for example, polycrystalline silicon doped with oxygen and/or nitrogen. The insulating filler material 46 may be, for example, a deposited silicon dioxide or nitride.

In both of the embodiments of FIGS. 7 and 8, the semi-insulating material extends to the same height 81 as the insulating layer 44 at the trench side-walls. In these specific examples the height 81 also coincides with the surface 11, although it may be lower.

In the device of FIG. 7, the insulating filler material 46 fills the remainder of the trench 41 to a lower level than the height 81. This is achieved by etching away the material 46 from the upper part of the trench 41. For this purpose, the insulating filler material 46 is chosen so as to be selectively etchable with respect to the insulating layer 44. Thus, for example, the material 46 may be silicon nitride while the layer 44 may be silicon dioxide, or vice versa. In this FIG. 7 construction, the electrode 31 contacts the exposed side of the layer 42a in the upper part of the trench. Thus, the resistive path 42 starts at the top (level 82) of the etched-back insulating filler 46. The part of the layer 42a of semi-insulating material above the level 82 provides a protective buffer between the electrode 31 and the insulating layer 44. This may be particularly beneficial when the level 82 is slightly deeper than the p-n junction 24.

In the device of FIG. 8, the insulating filler material 46 fills the remainder of the trench 41 to the same height 81 as the insulating layer 44 and the semi-insulating layer 42a. However, the resistive path 42 starts at a lower level 82. This is achieved by converting the upper part of the layer 42a, between the levels 81 and 82, into a terminal region 48 by implanting and/or diffusing a high dose of conductive dopant, as in FIG. 2. Thus, the highly-doped terminal region 48 is laterally sandwiched between the insulating layer 44 and the insulating in-fill 46. The device electrode 31 that contacts the device region 23 also contacts this terminal region 48 of the resistive path 42.

Each of FIGS. 1, 2, 3, 7 and 8 illustrates a trench-gate MOST embodiment, in which the trench-gate electrode 33 extends through the thickness of the p-type body region 23 to the drain drift region 20. However, a DMOST configuration may alternatively be realised in which a planar gate electrode 33' is present on a gate dielectric 34 on the surface 11. In DMOST, the body region 23 and drain-drift region 20 extend to the surface 11 below the centre of the gate electrode 33'.

The present invention may also be used for a diode rectifier, having a p+ anode region 23 and an n+ cathode region 22 as its main electrode regions. These regions 22 and 23 are separated by the intermediate voltage-sustaining zone 20. The region 23 forms the rectifying p-n junction with this n-type zone 20. Thus, there are no device parts 21, 33 & 34 in such a diode rectifier, and the p-type region 23 is continuous apart from its interruption by the field-shaping regions 40.

The simplified schematic drawing of FIG. 4A is useable generally for representing embodiments of the present invention of the FIG. 1 type, including a trench-gate MOS- FET embodiment, a DMOST embodiment and a PN diode rectifier embodiment. Similarly, simplified schematic drawings can be made that are useable generally for representing embodiments of the present invention of the FIGS. 2, 3, 7 and 8 types, including trench-gate MOSFET embodiments, DMOST embodiments and PN diode rectifier embodiments.

In all the embodiments so far illustrated, the voltage-sustaining zone 20 is a semiconductor region of a first conductivity type (n-type; in this example) that extends to the insulated side-wall of the trench 41. Modifications are also possible in which the voltage-sustaining zone 20 comprises interposed semiconductor first and second regions 20a and 20b of respective first and second conductivity types (n-type & p-type). The n-type regions 20a may be separated from the insulated side-walls of the trenches 41 by the p-type regions 20b. In this case, the p-n junction 24 extends laterally to the side-wall region 20b. The dimensions and dopant concentrations of these regions 20a and 20b are such that, when the voltage-sustaining zone 20 (20a, 20b) is depleted in the voltage-blocking mode, these depleted regions 20a and 20b have a space charge per unit area that substantially balances. However, the primary function of the p-type side-wall region 20b is to act as a shield for residual charge in the resistive layer 42a in the on-state of the device. Such a multiple zone 20 (20a,20b) is disclosed in WO 01/59846 (our ref. PHNL000067). Embodiments of the present invention having the different levels 81 and 82 could have such a multiple zone 20 (20a,20b) in, for example, modifications of FIGS. 1, 2, 3, 7 and 8.

The various implementations so far illustrated and/or described for the resistive paths 42, insulating layer 44, electrode 31, and voltage-sustaining zone 20 may be used for many device types in accordance with the invention. Particular examples are trench-gate MOSFETs, DMOS transistors, and PN rectifier diodes.

Other known features, for example from DE-A-198 48 828, WO 01/59844, WO 01/59846 and WO 01/59847 may also be used in combination with the different levels 81 and 82 in accordance with the present invention.

Thus, from reading the present disclosure, other variations and modifications will be apparent to persons skilled in the art. Such variations and modifications may involve equivalent and other features which are already known in the design, manufacture and use of semiconductor devices, and which may be used instead of or in addition to features already described herein.

Although claims have been formulated in this application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to any such features and/or combinations of such features during the prosecution of the present application or of any further application derived therefrom.

What is claimed is:

1. A semiconductor device comprising a semiconductor body in which a p-n junction is formed between a first device region of one conductivity type and an underlying voltage-sustaining zone, wherein a trenched field-shaping region extends in a trench through the voltage-sustaining zone to an underlying second device region, the trench extends from an upper surface of the body through the first device region and the voltage-sustaining zone, the trench accommodates a resistive path of semi-insulating material that is connected between the second device region and a device electrode that contacts the first device region, the resistive path starting below the level of the upper surface of the body, an insulating layer is present at side-walls of the trench to dielectrically couple potential from the resistive path to the voltage-sustaining zone, the first device region extending laterally to the insulating layer, and the voltage-sustaining zone is so dimensioned and doped between the trenched field-shaping regions as to be depleted of free charge carriers between the trenched field-shaping regions in a voltage-blocking mode of operation of the device by the spread of a depletion layer from the p-n junction, the device being characterized in that the insulating layer extends at the side-walls of the trench to an upper level that is higher than a lower level at which the resistive path starts in the trench, which lower level is more closely aligned to the depth of the p-n junction in the body and is protected by the insulating layer, and in that the semi-insulating material extends to the upper level in the trench but is highly doped with conductive dopant between the upper and lower levels so as to form a terminal region of the resistive path, and in that the device electrode that contacts the first device region also contacts this terminal region of the resistive path.

2. A device according to claim 1, further characterized in that the semi-insulating material is absent above the lower level in the trench, and the device electrode that contacts the first device region extends into the upper part of the trench to contact the resistive path at this lower level.

3. A device according to claim 1, further characterized in that the lower level is close to but slightly below the depth to which the p-n junction extends in the body.

4. A device according to claim 1, further characterized in that the first device region is a transistor body region of an insulated gate field-effect transistor, the device electrode that contacts the first device region is a source electrode that also contacts a source region of opposite conductivity type, and an insulated gate electrode is coupled to the transistor body region for controlling a conduction channel in an on-state of the transistor between the source region and the underlying voltage-sustaining zone that provides a drain drift region of the transistor.

5. A device according to claim 4, further characterized in that the upper level to which the insulating layer extends is below the upper surface of the body, and in that the source electrode extends into the upper part of the trench to contact both the transistor body region and the source region at the side-wall of the trench and to contact the resistive path at the lower level in the trench.

6. A device according to claim 5, further characterized in that the insulated gate electrode is a trench-gate structure that is located in between trenches of the trenched field-shaping regions, and in that the source region extends laterally from an insulated side-wall of the trench-gate structure to the side-wall of the neighbouring trench of the trenched field-shaping regions.

7. A device according to claim 1, further characterized in that the upper level to which the insulating layer extends coincides substantially with the upper surface of the body.

8. A device according to claim 1, further characterized in that the resistive path of the trenched field-shaping regions comprises a layer of the semi-insulating material on the insulating layer at the side-walls of the trench, and in that an insulating filler material is present on the layer of the semi-insulating material to fill the remainder of the trench to a desired level.

9. A device according to claim 8, further characterized in that the insulating filler material is selectively etchable with respect to the insulating layer at the side-walls of the trench, and in that the insulating filler material fills the remainder of the trench to a lower level than the height to which the layer of the semi-insulating material extends.

10. A device according to claim 1, further characterized in that voltage sustaining zone comprises a region of the opposite conductivity type that is separated from the insulating layer at the side walls of the trench by a side-wall region of the one conductivity type, and the p-n junction extends laterally to said side-wall region.

11. A device according to claim 1, further characterized in that the p-n junction extends laterally to meet the insulating layer at the side wall of the trench.

* * * * *